United States Patent
Lai et al.

(10) Patent No.: US 9,154,122 B2
(45) Date of Patent: Oct. 6, 2015

(54) LATCH UP DETECTION

(75) Inventors: Da-Wei Lai, Singapore (SG); Mahadeva Iyer Natarajan, Clifton Park, NY (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 13/406,534

(22) Filed: Feb. 28, 2012

(65) Prior Publication Data

US 2013/0222950 A1     Aug. 29, 2013

(51) Int. Cl.
*H03K 17/082* (2006.01)
*H01L 23/62* (2006.01)
*H01L 27/092* (2006.01)

(52) U.S. Cl.
CPC .............. *H03K 17/082* (2013.01); *H01L 23/62* (2013.01); *H01L 27/0921* (2013.01); *H01L 2924/0002* (2013.01)

(58) Field of Classification Search
USPC ....................................................... 361/93.1
See application file for complete search history.

(56) References Cited

U.S. PATENT DOCUMENTS

| | | | | |
|---|---|---|---|---|
| 4,353,105 A | * | 10/1982 | Black | 361/101 |
| 4,797,724 A | | 1/1989 | Boler et al. | |
| 5,942,932 A | * | 8/1999 | Shen | 327/530 |
| 7,102,867 B2 | * | 9/2006 | Voldman | 361/93.1 |
| 7,663,853 B2 | * | 2/2010 | Ker et al. | 361/93.1 |
| 7,692,906 B2 | * | 4/2010 | Tailliet | 361/56 |
| 7,777,248 B1 | * | 8/2010 | Boyd et al. | 257/127 |
| 2007/0188952 A1 | | 8/2007 | Ker et al. | |
| 2012/0013379 A1 | | 1/2012 | Su et al. | |

* cited by examiner

*Primary Examiner* — Stephen W Jackson
*Assistant Examiner* — Ann Hoang
(74) *Attorney, Agent, or Firm* — Horizon IP Pte. Ltd.

(57) ABSTRACT

A device is presented. The device includes a first circuit coupled to first and second power rails of the device. The first circuit is subject to a latch up event in the presence of a latch up condition. The latch up event includes a low resistance path created between the first and second power rails. The device also includes a latch up sensing (LUS) circuit coupled to the first circuit. The LUS circuit is configured to receive a LUS input signal from the first circuit and generates a LUS output signal to the first circuit. When the input signal is an active latch up signal which indicates the presence of a latch up condition, the LUS circuit generates an active LUS output signal which creates a break in the low resistance path to terminate the latch up event.

15 Claims, 4 Drawing Sheets

LATCH UP DETECTION

BACKGROUND

In integrated circuits (ICs), latch up may occur in a four layer pnpn structure. The pnpn structure includes bipolar transistors. Under abnormal conditions, the bipolar transistors can be switched on by a trigger stimulus, such as a positive or negative voltage spike or positive or high negative current-forcing on an input or output pin or power pad of an IC. If the product of the gain of the transistors in the feedback loop is sufficiently large (e.g., b1×b2 is greater than 1) to sustain regeneration, an undesirable current path is created in the pnpn structure. Large amounts of current may be drawn through the pnpn structure, resulting in latch up. For example, large amounts of current may be drawn from the power supply or the I/O pad to ground. Latch up may cause circuit malfunction and/or irreversible damage to the IC.

Conventional techniques for preventing latch up include reducing well and substrate resistances to produce lower voltage drops. Reduced substrate resistance may be achieved with the use of guard rings to surround the wells of the transistors. For example, a heavily doped n-guard ring may surround an n-well and a heavily doped p-guard ring may surround a p-well. Well taps are to connect the well to the guard ring, reducing parasitic resistances. The guard ring have specific latch up design rules which must be met, such as width of the ring, distances of the ring to the I/O pad well tap lengths. These design rules are relatively large and inflexible. The inflexibility of large latch up design rules limits the flexibility for designers in the layout of the IC as well as requiring large chip area to prevent latch up.

The present disclosure is directed to providing flexible and compact latch up design rules.

SUMMARY

Embodiments generally relate to semiconductor devices which include a latch up detection circuit. In one embodiment, a device is presented. The device includes a first circuit coupled to first and second power rails of the device. The first circuit is subject to a latch up event in the presence of a latch up condition. The latch up event includes a low resistance path created between the first and second power rails. The device also includes a latch up sensing (LUS) circuit coupled to the first circuit. The LUS circuit is configured to receive a LUS input signal from the first circuit and generates a LUS output signal to the first circuit. When the input signal is an active latch up signal which indicates the presence of a latch up condition, the LUS circuit generates an active LUS output signal which creates a break in the low resistance path to terminate the latch up event.

In another embodiment, a method of forming a device is disclosed. The method includes providing a substrate for the device. A first circuit is formed on the substrate. The first circuit is coupled to first and second power rails of the device. The first circuit is subject to a latch up event in the presence of a latch up condition. The latch up event includes a low resistance path created between the first and second power rails. A latch up sensing (LUS) circuit is formed on the substrate. The LUS circuit is coupled to the first circuit. The LUS circuit is configured to receive a LUS input signal from the first circuit and generates a LUS output signal to the first circuit. When the input signal is an active latch up signal which indicates the presence of a latch up condition, the LUS circuit generates an active LUS output signal which creates a break in the low resistance path to terminate the latch up event.

In yet another embodiment, a method of forming a device is presented. A substrate is provided for the device. A first circuit is formed on the substrate. The first circuit is coupled to first and second power rails of the device. The first circuit is subject to a latch up event in the presence of a latch up condition. The latch up event includes a low resistance path created between the first and second power rails. The method further includes forming a latch up sensing (LUS) circuit coupled to the first circuit on the substrate. The LUS circuit includes first and second transistors coupled in series between the first and second power rails. The LUS circuit is configured to receive a LUS input signal from the first circuit and generates a LUS output signal to the first circuit. When the input signal is an active latch up signal which indicates the presence of a latch up condition, the LUS circuit generates an active LUS output signal which creates a break in the low resistance path to terminate the latch up event.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. In one embodiment, the devices include a latch up detection circuit. The latch up detection circuit detects latch up and prevents it from continuing. The devices, for example, may be any type of semiconductor devices, such as integrated circuits (ICs). The ICs can be incorporated into or used with, for example, electronic products, computers, cell phones, and personal digital assistants (PDAs). The devices may also be incorporated into other types of products.

Figure 1:
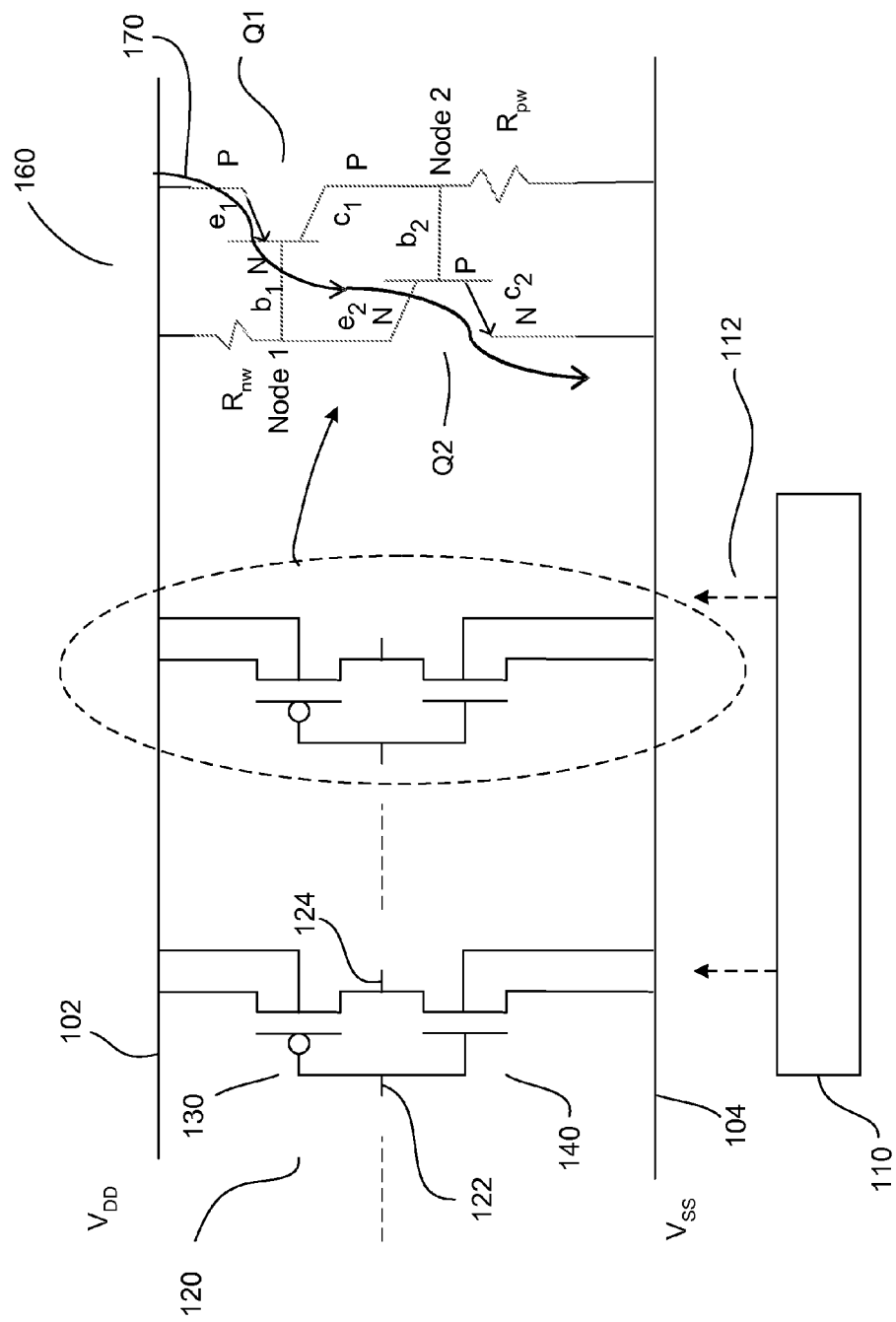
FIG. 1 shows an embodiment of a device.

FIG. 1 shows a portion of an embodiment of a device 100. As shown, the portion includes a plurality of cells 120. In one embodiment, the cells are inverter cells. The inverter cells, for example, are coupled in parallel between first and second power rails 102 and 104. The first power rail may be $V_{DD}$ (operating voltage) and the second power rail may be $V_{SS}$ (ground).

An inverter cell includes first and second transistors 130 and 140 coupled in series between the power rails. The first transistor is a p-type metal oxide semiconductor (MOS) transistor and the second transistor is a n-type MOS transistor. As such, the inverter is a complementary MOS (CMOS) structure. A first terminal of the first transistor is coupled to the first power rail while a second terminal of the first transistor is coupled to a second terminal of the second transistor. The first terminal of the second transistor is coupled to the second power rail. The body of the first transistor is coupled to the first power rail and the body of the second transistor is coupled to the second power rail. An input 122 of the inverter is commonly coupled to the gates of the transistors. An output 124 of the inverter is commonly coupled to the second terminals of the transistors.

The inverters are formed on a semiconductor substrate, such as silicon. Other types of substrates may also be useful. A product of the inverter structure formed on the substrate is a parasitic circuit 160. The parasitic circuit is a pnpn-based structure which may be subjected to latch up. The parasitic circuit, as shown, includes a pair of parasitic bipolar transistors Q1 and Q2. The first transistor Q1 is a PNP transistor having a first emitter terminal $e_1$ coupled to the first power rail and a first collector terminal $c_1$ coupled to the second power rail via a p-well resistor $R_{pw}$. The second transistor Q2 is a NPN transistor having a second emitter terminal $e_2$ coupled to a first base terminal $b_1$ of Q1 and the first power rail via a n-well resistor $R_{nw}$. A second collector terminal $c_2$ of Q2 is coupled to the second power rail. A second base terminal $b_2$ of Q2 is coupled between the first collector terminal and $R_{pw}$.

The portion of the device includes pads 110. The pads provide an injection source for a trigger stimulus, as indicated by arrows 112, which creates a latch up condition. The trigger stimulus may be inadvertently provided at the pads. The trigger stimulus, for example, may be a noise spike at the pads. The trigger stimulus produces a low resistance path (latch up path) formed by the pnpn junctions between the power rails, as indicated by arrow 170. In some embodiments, the trigger stimulus may be intentionally provided at the pads as part of a latch up testing. A pad, for example, may be an I/O pad or a power pad. In the case of an I/O pad, the latch up test stimulus may be a current injection. For the case of a power pad, the latch up test stimulus may be an over voltage injection. Providing other types of latch up stimuli may also be useful.

In one embodiment, the trigger stimulus causes the voltage at the Node 2 to be below ground, resulting in current flowing through $R_{pw}$ ($I_{RPW}$) to charge Node 2. If $I_{RPW}$ is sufficiently large, Q2 switches on. Q2 switches on when $I_{RPW}$ causes a voltage drop across $R_{pw}$ which exceeds the diode threshold voltage. The diode threshold voltage is about 0.7V (i.e., $I_{RPW}*R_{pw}=0.7V$). When the voltage drop between Node 2 and ground exceeds the diode threshold voltage, for example, 0.7V, Q2 switches on. Switching on Q2 causes current to flow through $R_{nw}$ ($I_{nw}$). If the voltage drop across $R_{nw}$ is sufficiently high, Q1 switches on. For example, when the voltage at Node 1 drops sufficiently, such as below the diode threshold voltage, the PN junction between the emitter e1 and the base of Q1 becomes conductive. As such, a low resistance path is created between the ends of the pnpn structure, as indicated by 170. For example, a low resistance path is formed between the power rails, creating a latch up condition.

Although, as described, the pnpn-based structure is derived from an inverter cell, other types of cells which produced a pnpn-based structure may also be useful. The pnpn-based structure, for example, may be derived from a NAND or NOR cell. In other embodiments, any type of pnpn-based structure may also be useful. Furthermore, it is understood that the cells need not be coupled to I/O pads.

Figure 2A:
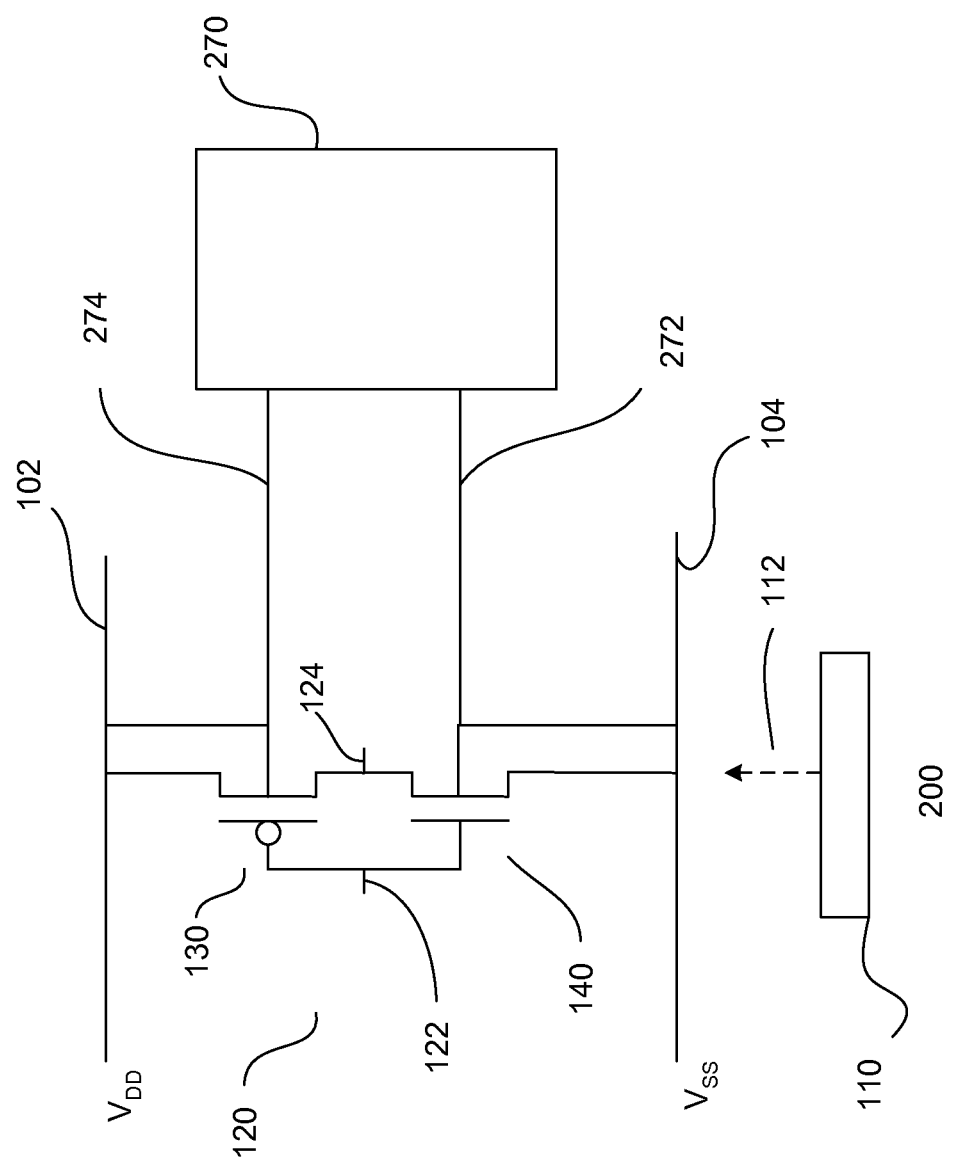
FIGS. 2a-b show embodiments of a device with latch up detection circuit.

FIG. 2a shows a portion of an embodiment of a device 200. As shown, the portion includes a latch up sensing (LUS) circuit 270 coupled to a cell 120. In one embodiment, the cell is an inverter cell. The inverter is similar to that described in FIG. 1. The elements of the inverter may not be discussed or discussed in detail. In some embodiments, the cell may be a NAND or NOR cell. In other embodiments, the cell may be any type of cells which produce a pnpn structure.

The LUS circuit includes a LUS input 272 and a LUS output 274 coupled to the cell. The LUS input is coupled to the cell to sense a latch up condition. For example, the LUS input receives an active LUS input signal from the cell at the LUS input which indicates a latch up condition. The latch up condition may be a low resistance path between the power rails 102 and 104. The LUS output is coupled to the cell. The LUS circuit is coupled to generate an active LUS output signal to terminate the latch up condition when a latch up condition is sensed by the LUS input. For example, the LUS output signal is provided to the inverter circuit to cause an open in the latch up path, terminating the latch up condition. When no latch up condition is sensed, the LUS output signal is an inactive LUS output signal. The inactive LUS output signal does not impact the normal operations of the cell.

In one embodiment, the LUS circuit is coupled to an inverter. The LUS input is coupled to the body of the second transistor 140 to sense a latch up condition. The LUS output is coupled to the body of the first transistor 130 to interrupt or cause an open in the latch up path when a latch up condition is sensed or detected. This terminates the latch up condition. When no latch up condition is sensed, the LUS output signal is an inactive LUS output signal. This inactive LUS output signal does not impact the normal operations of the inverter.

Figure 2B:
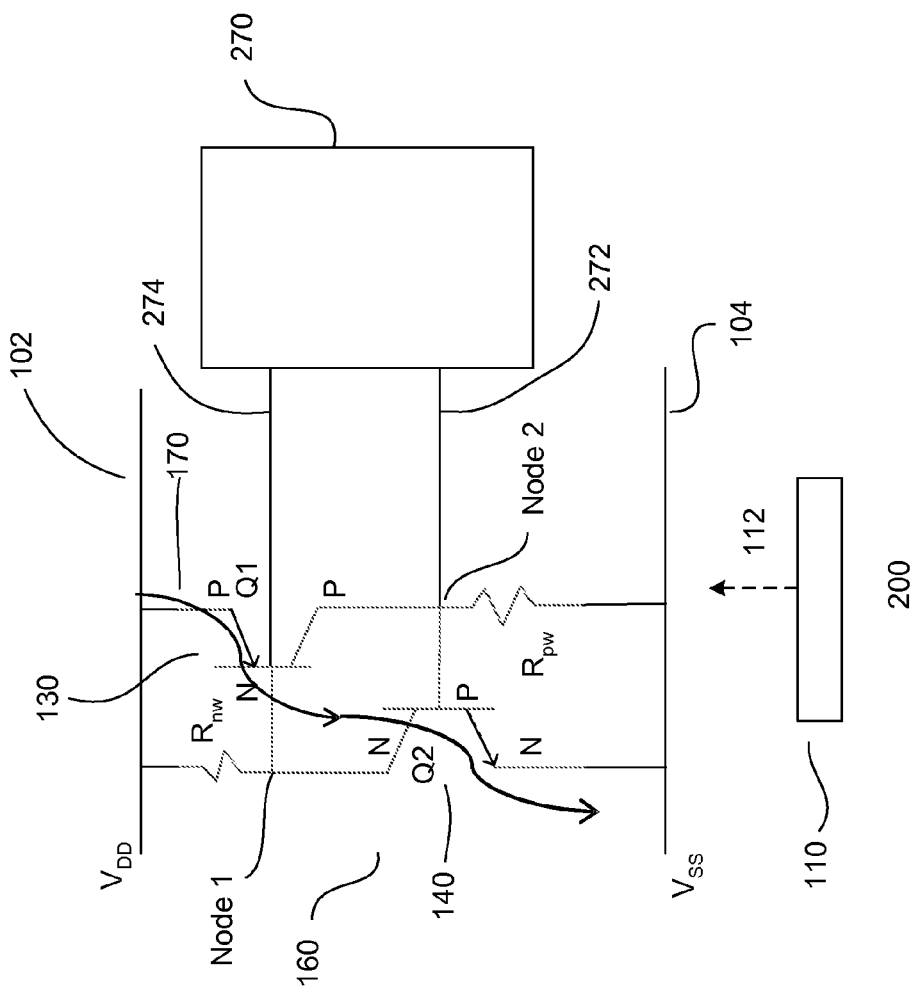

FIG. 2b shows a portion of an embodiment of a device 200. As shown, the portion includes a LUS circuit 270 coupled to a pnpn structure or circuit 160. The pnpn structure, for example, may be derived from an inverter circuit. Providing pnpn structures derived from other types of circuits may also be useful. The pnpn structure is similar to that described in FIG. 1 and the LUS circuit is similar to that described in FIG. 2a. The elements of the pnpn circuit and LUS circuit may not be discussed or discussed in detail. As shown, the LUS circuit includes a LUS input 272 and a LUS output 274. The LUS input and output are coupled to the pnpn circuit. In one embodiment, the LUS input is coupled to Node 2 and the output is coupled to Node 1 of the parasitic circuit.

Under normal conditions (e.g., no latch up condition), Node 2 will always be a logic 0 ("ground") signal. This results in Q2 being off or non-conductive. With Q2 being off, the LUS output signal will be a logic 1 signal. This will not affect normal function of the device because Q1 will be switched off, preventing the formation of a low resistance path between the power rails.

When latch up occurs, a low resistance path is created between the power rails, as indicated by arrow 170. This causes Node 2 to be charged up to a logic 1 signal. The logic 1 signal is an active latch up signal, which is provided to LUS input. The active latch up signal causes the LUS circuit to generate an active LUS output signal. In one embodiment, the active LUS output signal switches Q1 off. In one embodiment, the active LUS output signal is a logic 1 signal which switches off Q1. This terminates the low resistance path between the power rails 102 and 104, enabling the device to be in a latch up free condition. As such, the LUS detects a latch up condition and terminates it. In one embodiment, the latch up condition is terminated or prevented by the LUS circuit switching off Q1.

Figure 3:
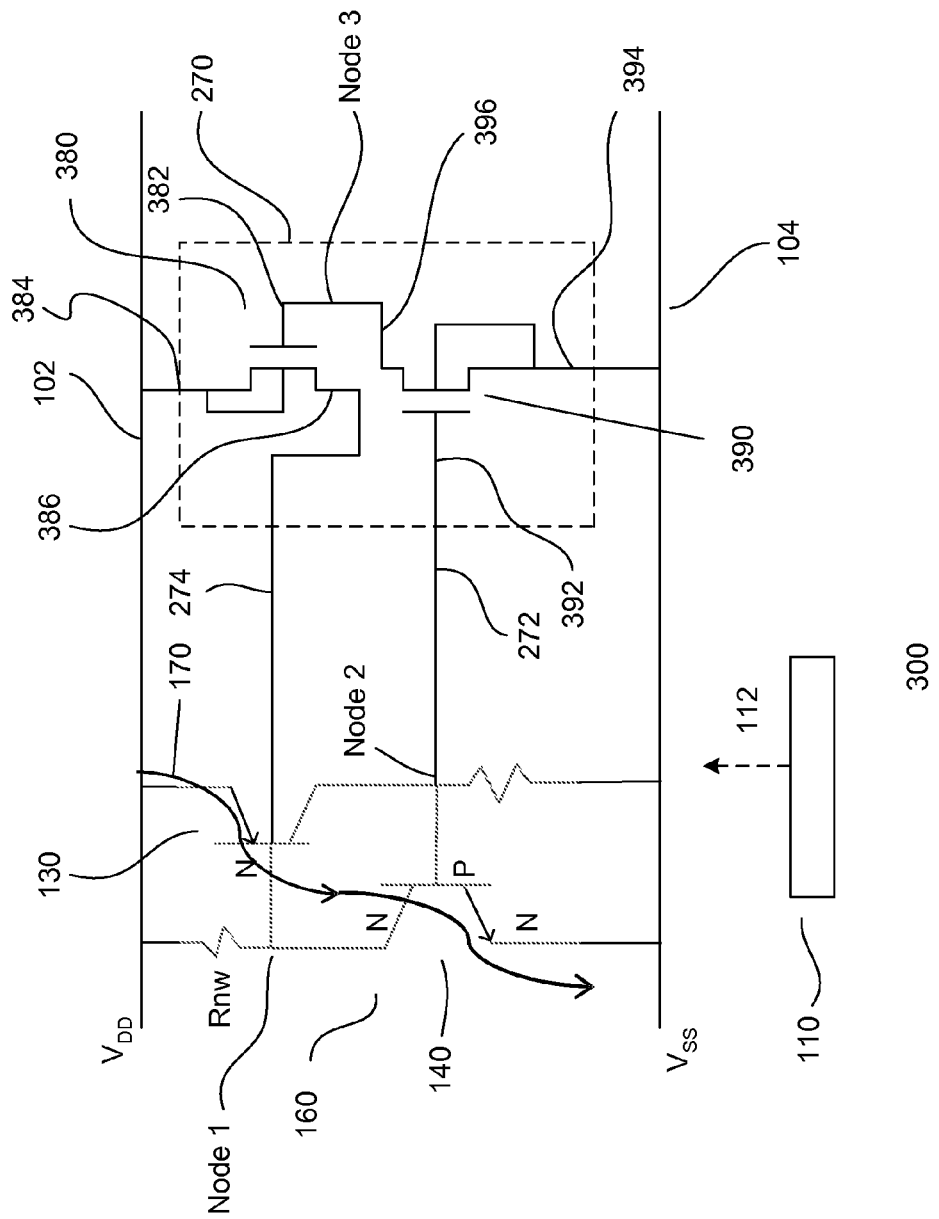
FIG. 3 shows an embodiment of a latch up detection circuit.

FIG. 3 shows a portion of another embodiment of a device 300. The portion shows a LUS circuit 270 coupled to a parasitic circuit 160 of an inverter. The parasitic circuit is similar to that described in FIG. 1 and the LUS circuit is similar to that described in FIGS. 2a-b. The elements of the parasitic and LUS circuits may not be discussed or discussed in detail. The LUS circuit includes a LUS input 272 and a LUS output 274. The parasitic circuit is coupled to a pad 110 which may provide a latch up trigger stimulus, indicated by arrow 112.

The trigger stimulus, when provided at the pad, causes a latch up condition. The trigger stimulus may be provided at the pad inadvertently or intentionally.

The LUS circuit includes first and second transistors 380 and 390 coupled in series between the first and second power rails. For example, the first and second transistors are coupled between $V_{DD}$ and $V_{SS}$. In one embodiment, the first transistor is a p-type MOS transistor and the second transistor is a n-type MOS transistor. A first terminal 384 and a body of the first transistor are coupled to the first power rail. The second terminal 386 of the first transistor is coupled to the output of the LUS circuit. A gate terminal 382 of the first transistor is coupled to a second terminal 396 of the second transistor. A first terminal 394 and body of the second transistor is coupled to the second power rail. A gate terminal 392 of the second transistor is coupled to the input of the LUS circuit. In one embodiment, the LUS input is coupled to Node 2 and the output is coupled to Node 1 of the parasitic circuit.

Under normal conditions (e.g., no latch up condition), Node 2 will always be a logic 0 ("ground") signal. Node 2 provides the logic 0 signal as an inactive latch up signal to the LUS circuit. The logic 0 signal switches the second transistor of the LUS circuit off. With the second transistor off, Node 3 of the LUS circuit is floated. For example, the voltage at Node 3 may be a logic 0 or logic 1 voltage. The voltage at Node 3 depends on the previous state. Regardless of the voltage at Node 3, the LUS output signal will be a logic 1 signal. This is because Q1 is switched off. With the LUS output signal being at logic 1, Q2 is switched off to prevent the formation of a low resistance path between the power rails. As such, the normal function of the device will not be affected.

When latch up occurs, a low resistance path is created between the power rails, as indicated by arrow 170. This causes Node 2 to be charged up to a logic 1 signal. The logic 1 signal is an active latch up signal, which is provided to LUS input. The active latch up signal causes the second transistor of the LUS circuit to switch on, resulting in Node 3 equal to a logic 0 signal. A logic 0 signal at the gate of the first transistor of the LUS circuit causes it to be switched on. This results in the LUS output signal to be an active LUS output signal (logic 1), which switches Q1 off to interrupt the low resistance path between the power rails. As such, the LUS detects a latch up condition and terminates it. In one embodiment, the latch up condition is terminated or prevented by the LUS circuit switching off Q1.

As described, latch up prevention is achieved without the need of inflexible latch up and large design rules. This imparts flexibility in IC design and space significant chip area. For example, latch up prevention can be achieved with the latch up detection/prevention circuit which employs two transistors. Furthermore, the latch up prevention is independent of the gain product of the transistors, which depends on spacing between the source of the PMOS and NMOS transistor, further reducing chip area requirements.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
    a first circuit directly coupled to both first and second power rails of the device, the first circuit comprises complementary metal oxide semiconductor (CMOS) transistors, the first circuit is subject to a latch up event in the presence of a latch up condition, the latch up event includes a low resistance path created between the first and second power rails;
    a latch up sensing (LUS) circuit, wherein the LUS circuit senses a latch up condition in the first circuit and terminates the latch up event when the latch up condition is sensed, the LUS circuit and the first circuit are distinct circuits, the LUS circuit is coupled to the first circuit, wherein the LUS circuit is configured to receive a LUS input signal at a LUS input from the first circuit and generate a LUS output signal at a LUS output to the first circuit, the LUS input signal and LUS output signal comprise voltage signals, wherein
        the LUS circuit includes first and second transistors coupled in between the first and second power rails,
        the first transistor is a p-type MOS transistor and includes a first p-transistor terminal, a second p-transistor terminal, a p-transistor body, and a p-transistor gate terminal, wherein the first p-transistor terminal is coupled to the first power rail, the second p-transistor terminal is coupled to the LUS output of the LUS circuit, and the p-transistor body is coupled to the first p-transistor terminal,
        the second transistor is a n-type MOS transistor and includes a first n-transistor terminal, a second n-transistor terminal, a n-transistor body, and a n-transistor gate terminal, wherein the first n-transistor terminal is coupled to the second power rail, the second n-transistor terminal is coupled to the p-transistor gate terminal, the n-transistor gate terminal is coupled to the LUS input of the LUS circuit, and the n-transistor body is coupled to the first n-transistor terminal, and
        when the input signal is an active latch up signal which indicates the presence of the latch up condition, the LUS circuit generates an active LUS output signal which creates a break in the low resistance path to terminate the latch up event.

2. The device of claim 1 wherein the first circuit includes a pnpn structure.

3. The device of claim 1 wherein the first circuit includes an inverter.

4. The device of claim 3 wherein the inverter includes a parasitic circuit having
    a first pnp parasitic bipolar transistor Q1 having a first collector terminal, a first emitter terminal and a first base terminal, and
    a second npn parasitic bipolar transistor Q2 having a second collector terminal, a second emitter terminal and a second base terminal.

5. The device of claim 4 wherein:
    the LUS output is coupled to the first base terminal; and
    the break in the low resistance path is created by switching off Q1.

6. The device of claim 4 wherein:
    the LUS output is coupled to the first base terminal; and
    the active LUS output signal switches off Q1 to break the low resistance path to terminate the latch up event.

7. The device of claim 6 wherein the LUS input is coupled to the second base terminal of Q2.

8. The device of claim 1 wherein the first power rail is $V_{DD}$ and the second power rail is $V_{SS}$.

9. A method of forming a device comprising:
    providing a substrate for the device;
    forming a first circuit on the substrate, the first circuit is directly coupled to both first and second power rails of the device, the first circuit comprises complementary metal oxide semiconductor (CMOS) transistors, the first circuit is subject to a latch up event in the presence of a latch up condition, the latch up event includes a low resistance path created between the first and second power rails; and forming a latch up sensing (LUS) circuit on the substrate, wherein the LUS circuit senses a latch up condition in the first circuit and terminates the latch up event when the latch up condition is sensed, the LUS circuit and the first circuit are distinct circuits, the LUS circuit is coupled to the first circuit, wherein the LUS circuit is configured to receive a LUS input signal at a LUS input from the first circuit and generates a LUS output signal at a LUS output to the first circuit, the LUS input signal and LUS output signal comprise voltage signals, wherein forming the LUS circuit includes forming a first p-type transistor comprising a first p-transistor terminal, a second p-transistor terminal, a p-transistor body, and a p-transistor gate terminal, wherein the first p-transistor terminal is coupled to the first power rail, the second p-transistor terminal is coupled to the LUS output of the LUS circuit, and the p-transistor body is coupled to the first p-transistor terminal, and a second n-type transistor comprising a first n-transistor terminal, a second n-transistor terminal, a n-transistor body, and a n-transistor gate terminal, wherein the first n-transistor terminal is coupled to the second power rail, the second n-transistor terminal is coupled to the p-transistor gate terminal, the n-transistor gate terminal is coupled to the LUS input of the LUS circuit, and the n-transistor body is coupled to the first n-transistor terminal, and when the input signal is an active latch up signal which indicates the presence of a latch up condition, the LUS circuit generates an active LUS output signal which creates a break in the low resistance path to terminate the latch up event.

10. The method of claim 9 wherein forming the first circuit includes forming a pnpn structure on the substrate which comprises:

a first pnp parasitic bipolar transistor Q1 having a first collector terminal, a first emitter terminal and a first base terminal;

a second npn parasitic bipolar transistor Q2 having a second collector terminal, a second emitter terminal and a second base terminal; and wherein the low resistance path is from the first power rail and through the first emitter terminal, first base terminal, second collector terminal, second emitter terminal and to the second power rail.

11. The method of claim 10 wherein forming the first circuit comprises forming an inverter on the substrate.

12. The method of claim 10 wherein the active LUS output signal switches off Q1 to break the low resistance path to terminate the latch up event.

13. The method of claim 10 wherein:

the LUS input is coupled to the second base terminal of Q2;

the LUS output is coupled to the first base terminal of Q1; and the active LUS output signal switches off Q1 to break the low resistance path to terminate the latch up event.

14. The method of claim 9 wherein the first power rail is $V_{DD}$ and the second power rail is $V_{SS}$.

15. The method of claim 9 wherein:

the first circuit comprises an inverter which includes a parasitic circuit having a first pnp parasitic bipolar transistor Q1 having a first collector terminal, a first emitter terminal and a first base terminal, and a second npn parasitic bipolar transistor Q2 having a second collector terminal, a second emitter terminal and a second base terminal;

the LUS input is coupled to the second base terminal of Q2;

the LUS output is coupled to the first base terminal of Q1; and the active LUS output signal switches off Q1 to break the low resistance path to terminate the latch up event.

* * * * *